United States Patent
Lim et al.

(10) Patent No.: US 10,224,515 B2
(45) Date of Patent: Mar. 5, 2019

(54) DISPLAY DEVICE HAVING TRANSMITTANCE ADJUSTING LAYER

(71) Applicant: LG DISPLAY CO., LTD., Seoul (KR)

(72) Inventors: Heechul Lim, Paju-si (KR); GyuHyeong Han, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/271,956

(22) Filed: Sep. 21, 2016

(65) Prior Publication Data
US 2017/0084867 A1 Mar. 23, 2017

(30) Foreign Application Priority Data
Sep. 21, 2015 (KR) ........................ 10-2015-0133113

(51) Int. Cl.
| | |
|---|---|
| *H01L 51/52* | (2006.01) |
| *G02B 5/20* | (2006.01) |
| *G02B 5/22* | (2006.01) |
| *H01L 27/32* | (2006.01) |
| *G02B 27/01* | (2006.01) |

(52) U.S. Cl.
CPC .......... *H01L 51/5284* (2013.01); *G02B 5/207* (2013.01); *G02B 5/22* (2013.01); *G02B 27/0172* (2013.01); *H01L 27/3244* (2013.01); *H01L 51/5253* (2013.01); *H01L 51/5256* (2013.01); *G02B 27/017* (2013.01); *G02B 2027/0118* (2013.01)

(58) Field of Classification Search
None
See application file for complete search history.

(56) References Cited

U.S. PATENT DOCUMENTS

| | | | | |
|---|---|---|---|---|
| 8,630,040 B2* | 1/2014 | Bright | .................... | G02B 5/287 313/479 |
| 9,884,341 B2* | 2/2018 | Gleason | .................... | B05D 1/62 |
| 2004/0256983 A1* | 12/2004 | Hung | .................. | H01L 51/5281 313/506 |
| 2006/0246811 A1* | 11/2006 | Winters | .............. | H01L 51/5253 445/25 |

(Continued)

FOREIGN PATENT DOCUMENTS

| | | | | |
|---|---|---|---|---|
| CN | 1832643 A | * | 9/2006 | ............. B82Y 20/00 |
| WO | WO 2015/126172 A1 | | 8/2015 | |

OTHER PUBLICATIONS

Parylene Applications, Curtis Wright downloaded from URL<http://www.parylene.com/high-risk-electronics.php> on Sep. 13, 2017.*

(Continued)

*Primary Examiner* — Joseph Schoenholtz
(74) *Attorney, Agent, or Firm* — Birch, Stewart, Kolasch & Birch, LLP

(57) ABSTRACT

Discussed herein is an organic light-emitting display (OLED) device that may include an organic light-emitting element layer disposed on a substrate; and an encapsulation layer covering the organic light-emitting element layer to block moisture and/or oxygen from permeating, wherein the encapsulation layer includes a barrier film having at least one transmittance adjusting layer that adjusts a ratio at which light emitted from the organic light-emitting element layer exits the OLED device, whereby the use of a polarizer is avoided.

8 Claims, 5 Drawing Sheets

(56) References Cited

U.S. PATENT DOCUMENTS

| | | | | |
|---|---|---|---|---|
| 2006/0250084 | A1* | 11/2006 | Cok | H01L 51/5234 313/512 |
| 2007/0090751 | A1* | 4/2007 | Cok | H01L 27/3213 313/501 |
| 2008/0272367 | A1* | 11/2008 | Cok | H01L 51/5253 257/40 |
| 2009/0081356 | A1* | 3/2009 | Fedorovskaya | C23C 16/403 427/66 |
| 2009/0109537 | A1* | 4/2009 | Bright | G02B 5/287 359/588 |
| 2009/0278454 | A1* | 11/2009 | Fedorovskaya | G02B 5/201 313/512 |
| 2010/0295759 | A1 | 11/2010 | Tanaka | |
| 2012/0327498 | A1* | 12/2012 | Arai | H01L 51/5284 359/267 |
| 2013/0240862 | A1* | 9/2013 | Yoo | H01L 51/5246 257/40 |
| 2014/0071552 | A1* | 3/2014 | Uchiyama | G02B 1/115 359/885 |
| 2016/0055822 | A1* | 2/2016 | Bell | G02B 27/0172 345/207 |
| 2016/0197292 | A1* | 7/2016 | Lee | H01L 51/56 257/40 |
| 2016/0362588 | A1* | 12/2016 | Moon | C09J 143/04 |
| 2016/0372703 | A1* | 12/2016 | Khachatryan | H01L 51/5253 |

OTHER PUBLICATIONS

Lopez, J., et al. "Refractive Index and Bandgap Variation in Al 2 O 3—ZnO Ultrathin Multilayers Prepared by Atomic Layer Deposition.", Journal of Alloys and Compounds, vol. 691, 2017, pp. 308-315.*

Rana, A, "How to Find R.I. (N) of thin film from A, R%, T% data", downloaded from URL<https://www.researchgate.net/post/how_to_find_ri_n_of_thin_film_from_A_R_T_data> on Feb. 2, 2018.*

Johnson et al., "33.3: Contrast Enhancement of OLED Displays," 2000 SID International Symposium, Long Beach, California, vol. XXXI, May 16-18, 2000, pp. 519-521.

Lee et al., "Characteristics of contrast of active-matrix organic light-emitting diodes containing a black matrix and antireflection layers," Materials Chemistry and Physics, vol. 112, No. 3, 2008 (Dec. 20, 2008), pp. 734-737.

* cited by examiner

DISPLAY DEVICE HAVING TRANSMITTANCE ADJUSTING LAYER

CROSS-REFERENCE TO RELATED APPLICATIONS

This application claims the priority to Korean Patent Application No. 10-2015-0133113 filed on Sep. 21, 2015, in the Korean Intellectual Property Office, the disclosure of which is incorporated herein by reference.

BACKGROUND

Technical Field

The present disclosure relates to a display device included in equipment for implementing virtual reality and adjusting the brightness of the display device.

Description of the Related Art

Display devices provide a variety of information graphically on a screen and are the core technology of the era of information and communications. Accordingly, thinner and lighter display devices are being developed. Recently, different types of display devices for different applications have been developed. As one of such applications, there is an on-going research into a head mounted display (HMD).

As its name implies, a HMD is worn on or attached to a viewer's head and is frequently used as equipment for implementing virtual reality and/or augmented reality, sometimes in conjunction with 3D display technology. The virtual reality is the technology that establishes a simulation environment by using computer techniques and enables a viewer to experience a similar environment of the real world. Namely, a HMD allows a viewer to feel a virtual image as if it was real by providing vivid images, video, voice, etc. As a HMD is worn on a viewer's head, it also has lenses that allow the viewer to see things that are nearby. Referring to the HMD shown in FIG. 1 according to a related art, the HMD may include a display device 10, a control device 200, lenses 300, a holder 400, and a cover 500.

The display device 10 may include a light and thin display device such as a liquid-crystal display (LCD) device, an organic light-emitting display (OLED) device, etc. The display device 10 is a type of a virtual reality display. The control device 200 may include a variety of sensors and processors and recognize a user's motions by using sensor technology and wireless technology to reflect it on a screen. Such technologies help improve the reality of contents displayed on the display device. Fish-eye lenses are frequently used as the lenses 300. A fish-eye lens is an ultra wide-angle lens that has an angle of view of 180 degrees or higher and gives a spherical view of the world thereby improving reality. The holder 400 secures the HMD to a viewer's head. The cover 500 is a component that covers the display device 10, the control device 200, the lens 300 and the holder 400 are coupled with one another.

A HMD shows images close to a viewer's eyes and thus the viewer can be deeply immersed into the displayed environment. This is why the HMD is developed for implementing virtual reality. Accordingly, HMDs have been applied to military training, medical service, aerospace development, as well as augmented reality industrial and educational purposes, virtual reality (VR) experience devices, monitors for wearable PCs, theme parks, movies, and gaming display devices, etc.

In virtual reality devices such as HMDs, images are displayed right in front of the eyes, and thus such display devices need to address certain technical issues. Here, the present inventors recognized that such display devices for virtual reality need to achieve a certain level of high resolution display capabilities for improving the user's immersion experience, need to resolve form factor issues (e.g., wearable comfort, weight reduction, etc.), and the like.

SUMMARY

In view of the above, an object of the present disclosure is to provide an OLED device employed by equipment for implementing virtual reality and a structure for adjusting brightness used therein.

More specifically, an object of the present disclosure is to provide a structure for adjusting transmittance of the OLED device.

Another object of the present disclosure is to provide a barrier film including the structure for adjusting transmittance.

According to an exemplary embodiment of the present disclosure, there is provided OLED device. The OLED device may include an organic light-emitting element layer disposed on a substrate; and an encapsulation layer covering the organic light-emitting element layer to block moisture and oxygen from permeating, wherein the encapsulation layer comprises a barrier film having at least one transmittance adjusting layer that adjusts a ratio at which light emitted from the organic light-emitting element layer exits the OLED device.

According to another exemplary embodiment of the present disclosure, there is provided an OLED device employed by equipment for implementing virtual reality. The OLED device may include an encapsulation layer having a structure for adjusting transmittance to achieve luminance characteristics appropriate for a display device for implementing virtual reality image display characteristics.

According to yet another exemplary embodiment of the present disclosure, there is provided a barrier film that suppresses moisture/oxygen from permeating into an organic light-emitting element and has a multi-layer structure. The barrier film includes at least one transmittance adjusting layer configured to adjust a transmittance of light emitted from the organic light-emitting element to fall within a particular range on behalf of a polarizing plate that need not be employed.

According to an exemplary embodiment of the present disclosure, a display device can have a luminance appropriate for equipment for implementing virtual reality.

Further, according to an exemplary embodiment of the present disclosure, a thinner and lighter VR display can be implemented.

Moreover, according to an exemplary embodiment of the present disclosure, production cost for a VR display can be saved.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
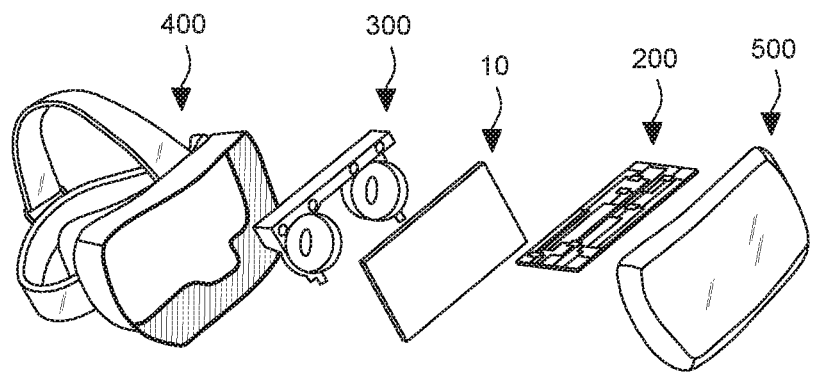
FIG. 1 is an exploded view of an example of equipment for implementing virtual reality according to a related art.

In describing components of exemplary embodiments of the present disclosure, terms such as first, second, A, B, (a), (b), etc., may be used. These terms are used only to differentiate a component from another component. Therefore, the nature, sequence, order, number, etc., of the components are not limited by these terms. As used herein, phrases "an element A connected to an element B" or "an element A coupled with an element B" refer to that the element A may be directly connected to/coupled with the element B, that another element C may be interposed between the element A and the element B, and/or that the element A may be indirectly connected to/coupled with the element B via another element C. As used herein, a phrase "an element A on an element B" refers to that the element A may be disposed directly on the element B and/or the element A may be disposed indirectly on the element B via another element C. The drawings are not to scale and the relative dimensions of various elements in the drawings are depicted schematically and not necessarily to scale.

As used herein, the term "OLED device" or "display device" collectively refers to an organic light-emitting diode panel and a display device employing such an organic light-emitting diode panel. Typically, OLED devices may be divided into white organic light-emitting devices and RGB organic light-emitting devices. In a white organic light-emitting device, sub-pixels in each of pixels emits white light, and a set of color filters is used in each of the sub-pixels to filter white light to produce red light, green light or blue light. In addition, a white organic light-emitting device may include sub-pixels with no color filter for forming sub-pixels for producing white light. On the other hand, in a RGB organic light-emitting device, an organic emission layer is configured to emit light of a particular color in each of sub-pixels. For example, a single pixel includes a red sub-pixel having an organic emission layer for emitting red light, a green sub-pixel having an organic emission layer for emitting green light, and a blue sub-pixel having an organic emission layer for emitting blue light.

Features of various exemplary embodiments of the present disclosure may be combined partially or totally. As will be clearly appreciated by those skilled in the art, technically various interactions and operations are possible. Various exemplary embodiments can be practiced individually or in combination. Hereinafter, exemplary embodiments of the present disclosure will be described in detail with reference to the accompanying drawings.

Figure 2:
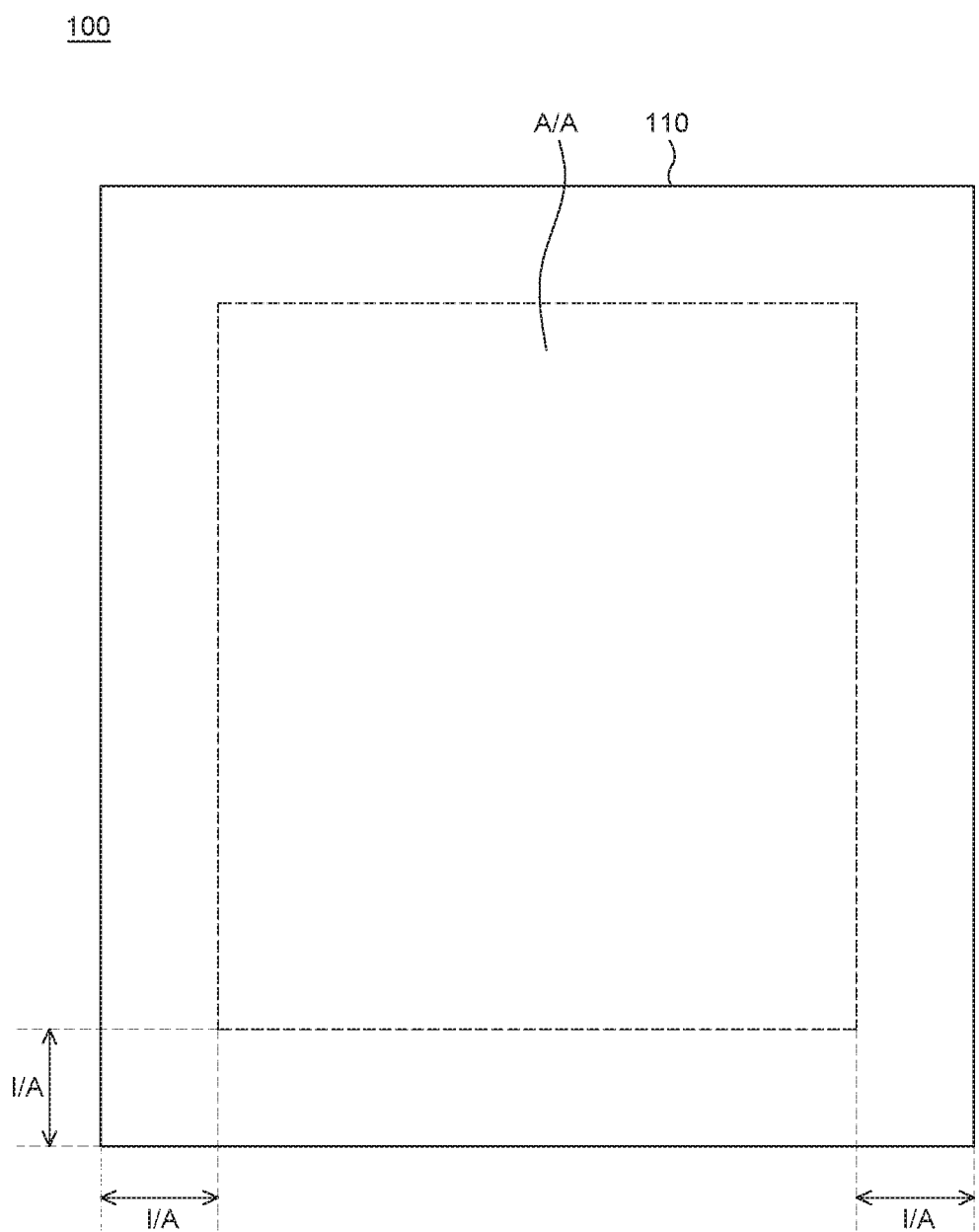
FIG. 2 is a plan view of an organic light-emitting display (OLED) device according to an exemplary embodiment of the present disclosure.

FIG. 2 is a plan view of an organic light-emitting display (OLED) device according to an exemplary embodiment of the present disclosure.

A display device applicable to equipment implementing virtual reality (hereinafter referred to as to a VR display) may include an LCD device, an OLED device, etc. In the following description, an OLED display device is an example of the VR display. The OLED device has the advantage as it is self-luminous by using an organic emission layer between electrodes and thus it can be thin. An OLED device typically has a structure which a pixel-driving circuit and an organic light-emitting element are formed on a substrate, and images are displayed by using light emitted from the organic light-emitting element.

Referring to FIG. 2, an OLED device 100 includes at least one active area A/A, in which an array of pixels is disposed. One or more inactive areas I/A may be disposed around the active area. That is, the inactive areas may be adjacent to one or more sides of the active area. In FIG. 2, the inactive areas surround a rectangular active area. However, the shape of the active area and the shape/layout of the inactive areas adjacent to the active area are not limited to those shown in FIG. 2. The active area and the inactive area may have a shape appropriate for the design of an electronic device employing the display device 100. For example, the active area may be a pentagon shape, a hexagon shape, a circle shape, an ellipse shape, etc., while the inactive area need not completely surround the active area. The display device 100 or any other OLED display device or other display device according to the embodiments of the present disclosure may be used in lieu of the display device 10 of FIG. 1.

Each of the pixels in the active area may be associated with a pixel circuit. The pixel circuit may include at least one switching transistor and at least one driving transistor. Each pixel circuit may be electrically connected to gate lines and data lines so as to cooperate with one or more driving circuits disposed in the inactive area, such as a gate driver and a data driver.

The driving circuit may be implemented as a TFT (thin-film transistor) in the inactive area. The driving circuit may be referred to as a GIP (gate-in-panel). In addition, some components such as a data driver IC (integrated circuit) may be mounted on a separated PCB and may be coupled with a connection interface (a pad, a bump, a pin, etc.) disposed in the inactive area by using a circuit film such as a FPCB (flexible printed circuit board), a COF (chip-on-film), a TCP (tape-carrier-package), etc. The printed circuits (COF, PCB, etc.) may be disposed behind the display device 100.

The OLED device 100 may include a variety of additional elements for generating various signals or for driving pixels in the active area. The additional elements for driving the pixel may include an inverter circuit, a multiplexer, an electro static discharge circuit, etc. The OLED device 100 may include additional elements other than those used for driving the pixels. For example, the OLED device may include additional elements for providing a touch sense function, a user authentication function (e.g., fingerprint recognition), a multi-level pressure sense function, a tactile feedback function, etc. The above-mentioned additional elements may be disposed in the inactive areas and/or an external circuit connected to the connection interface.

The OLED device according to the exemplary embodiment of the present disclosure may include a thin-film transistor and an organic light-emitting element on a lower substrate 110 and an encapsulation layer on the organic light-emitting element. The term, 'the lower substrate 110', may also refer to the substrate itself and elements and functional layers formed thereon, e.g., a switching TFT, a driving TFT connected to the switching TFT, an organic light-emitting element connected to the driving TFT, a barrier film, etc.

The lower substrate 110 supports a variety of elements of the OLED device 100 and is made of an insulative material.

The lower substrate 110 may be made of transparent, insulative materials such as glass, plastic, etc.

The organic light-emitting element is disposed on the lower substrate 110. The organic light-emitting element includes an anode, an organic emission layer formed on the anode, and a cathode formed on the organic emission layer. The organic emission layer may be made up of a single emission layer emitting light of a color or may be made up of a plurality of emission layers to emit white light. The organic light-emitting element may be formed in the center of the lower substrate 110 such that it is located in the active area. In the case where the organic emission layer of the organic light-emitting element emits white light, color filters may be disposed in the lower substrate 110.

The encapsulation layer may be disposed over the elements formed in the active area (A/A) in order to suppress moisture and/or gas such as oxygen from permeating. A face seal may be used as the encapsulation layer. An example of the face seal is a barrier film.

Figure 3:
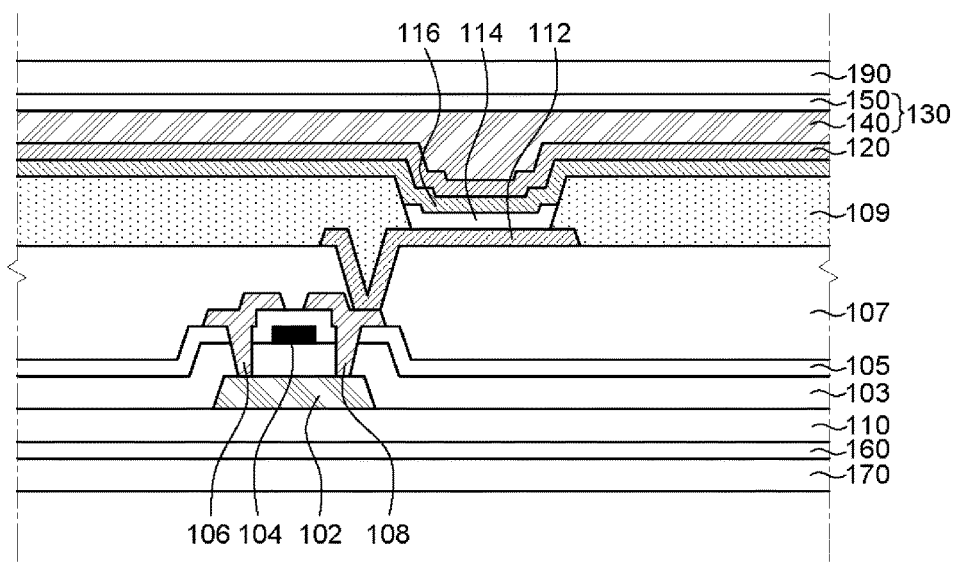
FIG. 3 is a cross-sectional view of a part of the active area of the OLED device according to an exemplary embodiment of the present disclosure.

FIG. 3 is a cross-sectional view of a part of the active area of the OLED device according to an exemplary embodiment of the present disclosure.

Referring to FIG. 3, a thin-film transistor (including elements 102, 104, 106 and 108) and an organic light-emitting element (including elements 112, 114 and 116) are disposed on the lower substrate 110.

The lower substrate 110 may be a glass or plastic substrate. Such a plastic substrate may be made of polyimide-based material or polycarbonate-based material and thus may have flexibility.

The thin-film transistor may be formed by sequentially stacking a semiconductor layer 102 on the lower substrate 110, a gate insulation film 103, a gate electrode 104, an interlayer insulation film 105, and a source electrode and a drain electrode 106 and 108.

The semiconductor layer 102 may be made of a polysilicon (p-Si) and may be partially doped with impurities. In addition, the semiconductor layer 102 may be made of amorphous silicon (a-Si) or may be made of a variety of organic semiconductor materials such as pentacene. Further, the semiconductor layer 102 may be made of oxide. The semiconductor layer 102 made of polysilicon may be formed by forming amorphous silicon to cure it such that the amorphous silicon is changed to polysilicon. This crystallization process may be carried out by a variety of methods including those that employ laser energy, RTA (rapid thermal annealing), use of materials that induce crystallization, SLS (Sequential Lateral Solidification), etc.

The gate insulation film 103 may be formed of an insulative material such as a silicon oxide ($SiO_x$) film and a silicon nitride ($SiN_x$) film or may be made of an insulative organic material. Gate electrode 104 may be made of a variety of conductive materials such as magnesium (Mg), aluminum (Al), nickel (Ni), chrome (Cr), molybdenum (Mo), tungsten (W), gold (Au) or an alloy thereof.

The interlayer insulation film 105 may be formed of an insulative material such as a silicon oxide ($SiO_x$) film and a silicon nitride ($SiN_x$) film or may be made of an insulative organic material. By selectively removing the interlayer insulation film 105 and the gate insulation film 103, contact holes may be formed via which a source region and a drain region are exposed, respectively.

The source electrode 106 and the drain electrode 108 are made of the same material as that of the gate electrode 104 and are made up of a single layer or a plurality of layers on the interlayer insulation film 105 such that the contact holes are filled with the electrodes 106 and 108, respectively.

A planarization layer 107 (or some other functional layer serving the same or similar purpose) may be disposed on the thin-film transistor. The planarization layer 107 protects the thin-film transistor and provides a flat surface. The planarization layer 107 may have a variety of forms. For example, the planarization layer 107 may be made of an organic insulation film such as BCB (benzocyclobutene) and acryl or may be made of an inorganic insulation film such as silicon nitride (SiNx) film, silicon oxide (SiOx) film or a combination thereof. In addition, the planarization layer 107 may be made up of a single layer, a double layer, or a multi-layer.

The organic light-emitting element may be formed by stacking a first electrode 112, an organic emission layer 114 and a second electrode 116 in this order or sequence. That is, the organic light-emitting element may include the first electrode 112 formed on the planarization layer 107, the organic emission layer 114 disposed on the first electrode 112, and the second electrode 116 disposed on the organic emission layer 114.

The first electrode 112 is electrically connected to the drain electrode 108 of the driving thin-film transistor via the contact hole. In the case where the OLED device 100 is of a top-emission type, the first electrode 112 may be made of an opaque, conductive material having high reflectivity. For example, the first electrode 112 may be made of silver (Ag), aluminum (Al), gold (Au), molybdenum (Mo), tungsten (W), chrome (Cr) or an alloy thereof.

A bank 109 (or similar structure) is formed in the rest of the area other than an emission area. Accordingly, the bank 109 has a bank hole or opening corresponding to the emission area, via which the first electrode 112 is exposed. The bank 109 may be made of an inorganic insulative material such as silicon nitride (SiNx) film and silicon oxide (SiOx) film or an organic insulative material such as BCB, acryl-based resin or imide-based resin.

The organic emission layer 114 is disposed on the first electrode 112 exposed via the hole of the bank 109. The organic emission layer 114 may include an emission layer, an electron injection layer, an electron transport layer, a hole transport layer, a hole injection layer, etc. Such layers may be all distinct or some may be implemented together into a single layer.

The second electrode 116 is disposed on the organic emission layer 114. In the case where the OLED device 100 is of a top-emission type, the second electrode 116 is made of a transparent, conductive material such as indium tin oxide (ITO) or indium zinc oxide (IZO), such that light generated in the organic emission layer 114 exits upwardly through the second electrode 116.

The encapsulation layer 130 may be disposed on the organic light-emitting element. The encapsulation layer 130 seals the organic light-emitting element to protect it from oxygen, moisture and the like. Although a variety of encapsulation structures and techniques may be applied, a face seal structure will be described in this exemplary embodiment of the present disclosure. Examples of the face seal structure may include a passivation layer, a barrier film, and an adhesive film.

A passivation layer 120 is disposed on the second electrode 116. The passivation layer 120 may be configured as an inorganic film made of glass, metal, aluminum oxide (AlOx) or silicon (Si)-based material or may be formed by stacking organic films and inorganic films alternately. The passivation layer 120 blocks oxygen and/or moisture from permeating from the outside. If an organic light-emitting element is exposed to moisture and/or oxygen, the emission area may shrink, i.e., pixel shrinkage may take place or dark spots may appear in the emission area.

The barrier film 150 may be disposed on the passivation layer 120. The barrier film 150 blocks oxygen and/or moisture from permeating into the front of the display device. The barrier film 150 may be a retarded film or an optically isotropic film. If the barrier film has optically isotropic property, the light incident on the barrier film is passed it without phase retardation. In addition, an organic film or an inorganic film may be further disposed on or under the barrier film 150. The inorganic film may include silicon oxide (SiOx) film or silicon nitride (SiNx) film. The organic film may include an acryl-based resin, an epoxy-based resin, a polymer material such as polyimide or polyethylene, etc.

The adhesive film 140 provides sealing and attaches the barrier film 150 to the passivation layer 120. In addition, the adhesive film 140 blocks moisture from permeating from side surfaces. B-PSA (barrier pressure sensitive adhesive) may be used as the adhesive film 140.

A lower adhesive layer 160 is formed or placed under the lower substrate 110 and a lower encapsulation layer 170 is formed or placed under the lower adhesive layer 160. The lower encapsulation layer 170 may be made of at least one material selected from the group consisting of: polyethylene naphthalate (PEN), polyethylene terephthalate (PET), polyethylene ether phthalate, polycarbonate, polyarylate, polyether imide, polyether sulfonate, polyimide and polyacrylate. The lower encapsulation layer 170 may suppress moisture and/or oxygen from permeating into the substrate.

The lower adhesive layer 160 is made of thermosetting adhesive or a naturally-curable adhesive and attaches the lower substrate 110 to the lower encapsulation layer 170. For example, the lower adhesive layer 160 may be made of an optically clear adhesive (OCA).

Figure 4:
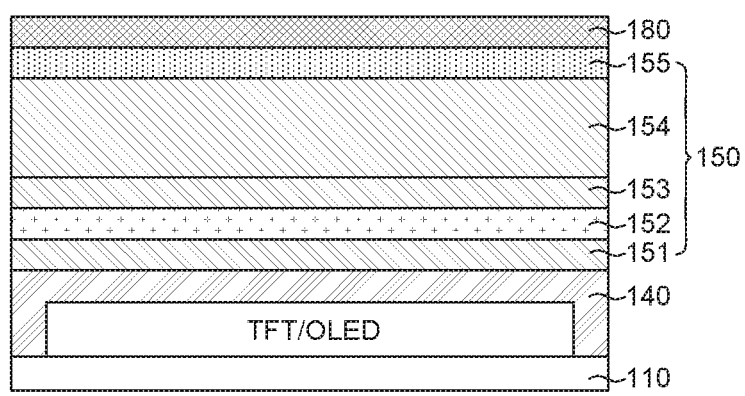
FIG. 4 is a cross-sectional view of an OLED device employed by equipment implementing virtual reality according to an embodiment of the present disclosure.

FIG. 4 is a cross-sectional view of an OLED device employed by equipment implementing virtual reality according to an embodiment of the present disclosure.

The OLED device (e.g., implemented for a virtual reality display) may include a lower substrate 110, a pixel-driving circuit and organic light-emitting element TFT/OLED, an adhesive film 140, a barrier film 150, and a polarizing plate 180.

For a virtual reality display device (VR display), it is necessary to reduce luminance of the display device because a viewer watches the display device in dark environment similar to a darkroom, because the display device is within a closed-off environment that is shielded from external light and located very close to the viewer's eyes. In the display device shown in FIG. 4, the polarizing plate 180 is disposed for this end.

The lower substrate 110 is made of an insulative material and supports a variety of elements of the OLED device 100.

The pixel-driving circuit and organic light-emitting element TFT/OLED is disposed on the lower substrate 110. The organic light-emitting element includes an anode, an organic emission layer formed on the anode, and a cathode formed on the organic emission layer. The organic emission layer may be made up of a single emission layer emitting light of a color or may be made up of a plurality of emission layers to emit white light. The organic light-emitting element may be formed in the center of the lower substrate 110 such that it is located in the active area. A variety of pixel-driving circuits and lines for driving the organic light-emitting element such as thin-film transistor, capacitors, etc., may be disposed in association with the organic light-emitting element. The structure and function of the pixel-driving circuit and the organic light-emitting element are substantially identical to those described above with reference to FIG. 3.

A passivation film for protecting the pixel-driving circuit and organic light-emitting element TFT/OLED may be disposed such that it covers the organic light-emitting element. The passivation film may be an inorganic film or may be formed by stacking organic films and inorganic films alternately.

The barrier film 150 blocks oxygen and/or moisture from permeating into the display device. FIG. 4 shows the barrier film 150 made up of multiple layers. The barrier film 150 may include an overcoating layer 151, a barrier coating layer 152, an undercoating layer 153, a base film 154 and a rear coating layer 155.

The overcoating layer 151 is disposed to protect the barrier coating layer 152. The overcoating layer 151 may be a thin film that is made of organic material and/or inorganic material and can have a thickness of 1 μm or less. The barrier coating layer 152 is disposed to suppress moisture permeation. The barrier coating layer 152 may be made of a flexible transparent polymer resin or an inorganic film. The undercoating layer 153 is disposed to couple the base film 154 with the barrier coating layer 152. The undercoating layer 153 may be an inorganic film having a thickness of several to tens of nanometers (nm). The base film is a base layer of the barrier film and may be made of CPO (cyclo olefin polymer), etc. The rear coating layer 155 enhances adhesion between the polarizing plate 180 and the barrier film 150.

The adhesive film 140 attaches the barrier film 150 to the TFT array substrate 110 and organic light-emitting element TFT/OLED. The adhesive film 140 may include a curable resin and a moisture adsorbent dispersed in the curable resin. The moisture adsorbent adsorbs moisture and/or oxygen due to a physical or chemical reaction, etc. Accordingly, the adhesive film 140 may block moisture from permeating into the display device. The adhesive film 140 exhibits good adhesive property and may be made of a material having high light transmittance, e.g., an epoxy-based material, an acryl-based material, an imide-based material, silane-based material or rubber-based material.

The polarizing plate 180 is used to block light that comes from the outside and is reflected off the elements to increase visibility. However, it is not necessary to block external light reflection since the VR display is used in dark environment similar to a darkroom. Instead, in the VR display, it is necessary to reduce luminance since a viewer's eyes are very close to the display device, and thus the polarizing plate 180 is used to reduce the amount of light that is emitted from the organic light-emitting element toward the outside of the display device, which is not the original function that a typical polarizing plate 180 is used to perform. Typically, the thickness of the polarizing plate may take up about 10 to 15% of the total thickness of the display device.

In some implementations, a UV resin layer and a touch film may be disposed on the polarizing plate 180. The touch film refers to a film on which a touch element for sensing a user's touch input is formed. A cover substrate can be additionally disposed on the top of the OLED device to further protect the OLED device from external impacts or damage.

Figure 5:
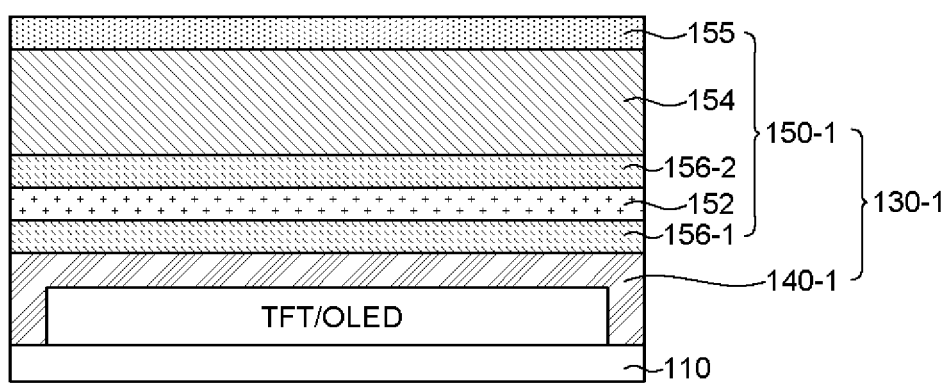
FIG. 5 is a cross-sectional view of an OLED device employed by equipment implementing virtual reality according to an exemplary embodiment of the present disclosure.

FIG. 5 is a cross-sectional view of an organic light-emitting display (OLED) device employed by equipment implementing virtual reality according to an exemplary embodiment of the present disclosure.

According to an embodiment shown in FIG. 5, a polarizing plate can be eliminated from an OLED device for a VR display, and the OLED device can achieve the luminance required by a VR display. This enables the display device to be thinner.

The OLED device 100 includes a lower substrate 110, a pixel-driving circuit and organic light-emitting element TFT/OLED and an encapsulation layer 130-1. FIG. 5 shows a top-emission OLED device. That is, in the OLED device shown in FIG. 5, light is generated in an organic light-emitting element layer and emitted upwardly through the encapsulation layer 130-1.

The lower substrate 110 and the pixel-driving circuit and organic light-emitting element TFT/OLED shown in FIG. 5 are substantially identical to those shown in FIG. 4; and, therefore, redundant descriptions will not be made.

The OLED device 100 may be employed by equipment implementing virtual reality. The OLED device 100 has luminance characteristics appropriate for implementing virtual reality that is adjusted by a structure for adjusting transmittance included in the encapsulation layer. The luminance characteristics refer to a luminance adjusted (i.e. reduced) appropriately for the use environment of the equipment implementing virtual reality.

The structure for adjusting transmittance adjusts the luminance of the OLED device 100 on behalf of the polarizing plate 180 shown in FIG. 4. The structure for adjusting transmittance achieves a luminance appropriate for virtual reality by adjusting the ratio (i.e. transmittance rate), that is, the light emitted outward the display device among the light generated in the organic light-emitting element. The structure for adjusting transmittance allows the display device to exhibit a screen luminance appropriate for the particular virtual reality environment. The structure for adjusting transmittance may be implemented with i) a transmittance adjusting layer (or some other functional layer serving the same or similar purpose) included in the barrier film and/or ii) an adhesive film (or some other functional element serving the same or similar purpose) having light-absorbing material. The structure for adjusting transmittance may allow the light emitted from the organic light-emitting element to pass outward from the OLED device within a particular range of the resulting transmittance rate, e.g., 40 to 60%. The particular range of transmittance rate may be determined based on the luminance required by the OLED device depending on use environment, characteristics of equipment employing the device (e.g., panel size, resolution, brightness, etc.), contents, etc. For example, an optimal peak luminance (e.g., 50%) may be determined in accordance with a duty ratio (e.g., 18.5%), the particular range of transmittance rate may be determined based on the determined optimal peak luminance.

Typically, an encapsulation layer is disposed to cover the organic light-emitting element layer to suppress moisture and/or oxygen from permeating. According to an exemplary embodiment of the present disclosure, however, the encapsulation layer 130-1 also adjusts the transmittance of the light emitted from the display device. The encapsulation layer 130-1 includes a barrier film 150-1, which includes transmittance adjusting layers 156-1 and 156-2 for adjusting the ratio (transmittance rate) at which the light emitted (generated) in the organic light-emitting element layer exits the display device.

The barrier film 150-1 may be a film having multi-layer structure in which multiple layers are stacked one on another to suppress oxygen and/or moisture from permeating into the organic light-emitting element. In addition, the barrier film 150-1 may include one or more transmittance adjusting layers 156-1 and 156-2 that adjust the transmittance of the light emitted from the organic light-emitting element to a particular range, on behalf of the polarizing plate.

FIG. 5 shows the barrier film 150-1 according to an exemplary embodiment of the present disclosure. The barrier film has improved gas transmittance characteristics by coating a plurality of layers of organic/inorganic films on a surface of a flexible plastic film, e.g., PET, PC, PEN, PES, etc. The barrier film may have a transmittance adjusting layer made up of a single layer or multiple layers, e.g., two to seven layers. FIG. 5 shows the barrier film including two transmittance adjusting layers 156-1 and 156-2. The barrier film shown in FIG. 5 may be formed by replacing the overcoating layer 151 and the undercoating layer 153 shown in FIG. with two transmittance adjusting layers 156-1 and 156-2. Accordingly, the barrier film shown in FIG. 5 may have the same thickness as the barrier film shown in FIG. 4 and may be formed by a similar fabricating process.

The barrier film 150 may include a barrier coating layer 152, a base film 154, a rear coating layer 155 and transmittance adjusting layers 156-1 and 156-2.

The barrier coating layer 152 suppresses oxygen and/or moisture from permeating. The barrier coating layer 152 may be made of a flexible, transparent polymer resin (polycarbonate (PC), polyethylene terephthalate (PET), polyimide (PI), polypropylene (PP), polyethylene (PE), etc.) or an inorganic ($SiON_x$) film, etc. The barrier coating layer 152 may have a thickness of 100 nm or less.

The base film 154 is a base layer of the barrier film and may be made of an optically isotropic CPO (cyclo-olefin polymer) film, etc. The base film 154 may have a thickness of approximately 50 micrometers (μm).

The rear coating layer 155 is a coating layer that enhances adhesion between the barrier film and the structure thereon. The rear coating layer 155 may be an inorganic film having a thickness of several to tens of nanometers (nm).

The transmittance adjusting layers 156-1 and 156-2 may adjust the transmittance of light emitted from the organic light-emitting element layer to achieve a luminance required by the display device employed by equipment implementing virtual reality. That is, the transmittance adjusting layers 156-1 and 156-2 may adjust the transmittance of the light emitted from the organic light-emitting element layer to a predetermined range, e.g., 40 to 60% based on the luminance required by the VR display. Specifically, the resulting transmittance and spectrum can be adjusted by adjusting the refractive index and thickness of each of the transmittance adjusting layers 156-1 and 156-2. For example, to achieve a transmittance of 40 to 60%, the refractive index and thickness of each of the transmittance adjusting layers 156-1 and 156-2 are adjusted to 0.2 or higher and 10 nm to 1 respectively. The transmittance adjusting layers 156-1 and 156-2 may be made of silicon oxide (Si-Oxide), titanium oxide (Ti-Oxide), etc.

In the example shown in FIG. 5 where the two transmittance adjusting layers 156-1 and 156-2 are disposed, the first transmittance adjusting layer 156-1 may transmit the light emitted from the organic light-emitting element layer at a transmittance between 70% and 80%, and the second transmittance adjusting layer 156-2 may transmit the light having passed the first layer 156-1 at a transmittance between 40% and 60%. In a similarly manner, more than two transmittance adjusting layers may be disposed to achieve a resulting transmittance required by the display device.

The transmittance adjusting layers may be configured to allow the light generated from the organic light-emitting element layer to emit from the OLED device at a particular resulting transmittance, e.g., 40 to 60%. For example, both of the two transmittance adjusting layers 156-1 and 156-2 may have the transmittance of 50% or may have transmittances of 50% and 60% respectively, such that the resulting transmittance of the OLED device may be adjusted to 50%.

The adhesive layer 140-1 may seal the organic light-emitting element and attach the barrier film 150-1 to an organic light-emitting element layer TFT/OLED. The adhesive film 140-1 may be a film containing a curable resin and a (moisture/oxygen) adsorbent dispersed in the curable resin. The curable resin is a base material of the adhesive layer 140-1 and may be made of a thermosetting resin or a photocurable resin. The curable resin may be made of, but is not limited to, an epoxy-based polymer, an olefin-based polymer, etc. The adsorbent adsorbs removes moisture and/or oxygen by a physical or chemical reaction, etc. For example, the adsorbent may be a reactive adsorbent that chemically reacts with moisture and/or oxygen introduced into the adhesive layer 140-1 to adsorb the moisture and/or the oxygen, or may be a physical adsorbent that suppresses moisture and/or oxygen from permeating by making paths via which the moisture and/or the oxygen moves longer. The type of the adsorbent is not particularly limited. For example, the adsorbent may be a reactive adsorbent such as a metal powder including alumina, a metal oxide, a metal salt, phosphorous pentoxide ($P_2O_5$) or a mixture thereof. For another example, the adsorbent may be a physical adsorbent such as silica, zeolite, titania, zirconia, montmorillonite, etc. The metal oxide may be lithium oxide ($Li_2O$), sodium oxide ($Na_2O$), barium oxide (BaO), calcium oxide (CaO) or magnesium oxide (MgO). The metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$). In addition, the metal salt may be a metal halide such as calcium chloride ($CaCl_2$), magnesium chloride ($MgCl_2$), strontium chloride ($SrCl_2$), chloride, yttrium ($YCl_3$), copper chloride ($CuCl_2$), cesium fluoride (CsF), fluoride tantalum ($TaF_5$), fluoride, niobium ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$), or a metal chlorate such as barium perchlorate ($Ba(ClO_4)_2$), magnesium perchlorate ($Mg(ClO_4)_2$) It is to be noted that the moisture adsorbent is not limited to those listed above.

The adhesive layer 140-1 may be an adhesive film that further contains a light-absorbing material (e.g., B-PSA). The light absorbing material contained in the adhesive layer 140-1 may adjust (reduce) the transmittance of the OLED device. That is, the light emitted from the organic light-emitting element layer transmits the adhesive layer 140-1 at a particular transmittance due to the light-absorbing material. The adhesive layer 140-1 containing the light-absorbing material may perform a similar function with the transmittance adjusting layers disposed in the barrier film.

The light-absorbing material may include one of Pararosaniline, Methylene blue, Crystal violet, Pyronin, Toluidine blue, Thionin, Cresyl violet, Celeastine blue, Natural red, Safranin, Bismarck brown, Acid fuchsin, Aniline blue, Eosin Y, Phloxine, Azocarmine, Orange G, Tartrazine, Congo red, Biebrich scarlet, Picric acid, Martius yellow, Romanowsky, Hematein, Celestine blue B, Alizaline red, and a mixture thereof. The light-absorbing material is mixed at a percentage of 10% or less, with different proportions of dyes to adjust the transmittance of different wavelength ranges.

The adhesive layer 140-1, together with the transmittance adjusting layers 156-1 and 156-2, may adjust the transmittance of light emitted from the organic light-emitting element layer to achieve luminance required by the display device implementing virtual reality. That is, the transmittance adjusting layers 156-1 and 156-2 may allow the light emitted from the organic light-emitting element layer to pass through the three layers (the adhesive layer and the transmittance adjusting layers) at a particular range, e.g., 40 to 60% based on the luminance required by the VR display. For example, all of the adhesive layer 140-1 and the transmittance adjusting layers 156-1 and 156-2 may have the transmittance of 50% or may have transmittances of 50% and 60%, respectively, such that the resulting transmittance of the OLED device may be adjusted to 50%.

As such, the adhesive layer 140-1 and the transmittance adjusting layers 156-1 and 156-2 reduce the luminance on behalf of a polarizing plate, and thus the OLED device according to the exemplary embodiment of the present disclosure can achieve the brightness required by a VR display even without a polarizing plate on the encapsulation layer. This enables the display device to be thinner. As set forth above, according to an exemplary embodiment of the present disclosure, a thinner and lighter VR display can be implemented. In addition, according to an exemplary embodiment of the present disclosure, a polarizing plate can be eliminated from an OLED device for a VR display and thus production cost can be saved.

The exemplary embodiments of the present disclosure can also be described as follows.

According to an aspect of the present disclosure, an OLED device includes an organic light-emitting element layer disposed on a substrate; and an encapsulation layer covering the organic light-emitting element layer to block moisture and oxygen from permeating, wherein the encapsulation layer comprises a barrier film having at least one transmittance adjusting layer that adjusts a ratio at which light emitted from the organic light-emitting element layer exits the OLED device.

The transmittance adjusting layer may be configured to adjust a transmittance of the light emitted from the organic light-emitting element layer to provide a luminance required for implementing virtual reality.

The transmittance adjusting layer may be configured to adjust the resulting transmittance rate of the light emitted from the organic light-emitting element layer to 40 to 60%.

The at least one transmittance adjusting layer may include a plurality of layers disposed above and below a barrier coating layer.

The transmittance adjusting layers may include two to seven layers.

Each of the transmittance adjusting layers may have a refractive index of 0.2 or higher and a thickness of 0.01 μm to 1 μm.

The encapsulation layer may further include an adhesive layer configured to attach the barrier film to the organic light-emitting element layer, and the adhesive layer may be made of a curable resin containing an adsorbent material.

The adhesive layer may further contain a light-absorbing material for adjusting transmittance.

The adhesive layer and the transmittance adjusting layer may be configured to allow the light emitted from the organic light-emitting element layer to transmit the adhesive layer and the transmittance adjusting layer at a resulting transmittance rate of 40 to 60%.

The adhesive layer and the transmittance adjusting layer may reduce a luminance on behalf of a polarizing plate, to thus forego the need of such polarizing plate.

According to another aspect of the present disclosure, an organic light-emitting display (OLED) device employed by equipment for implementing virtual reality includes an encapsulation layer having a structure for adjusting transmittance to provide luminance characteristics appropriate for a display device for implementing virtual reality image display characteristics.

The structure for adjusting transmittance may be configured to adjust a transmittance at which light generated in an organic light-emitting element exits the OLED device so that the OLED device exhibits a luminance appropriate for use environment for implementing said virtual reality image display characteristics.

The structure for adjusting transmittance may be implemented with a transmittance adjusting layer included in the barrier film and an adhesive film having light-absorbing material.

The structure for adjusting transmittance may allow the light generated from the organic light-emitting element to be emitted from the OLED device at a transmittance rate of 40 to 60%.

According to yet another aspect of the present disclosure, a barrier film, which suppresses moisture/oxygen from permeating into an organic light-emitting element and has a multi-layer structure, includes at least one transmittance adjusting layer configured to adjust a transmittance of light emitted from the organic light-emitting element to fall within a particular range on behalf of a polarizing plate that need not be employed.

The particular range may be determined based on a luminance required by a display device for implementing virtual reality image display characteristics.

While particular embodiments of the present disclosure have been disclosed, it is to be understood that various different modifications and combinations are possible without departing from the gist of the present disclosure by those skilled in the art. Accordingly, the exemplary embodiments described herein are merely illustrative and are not intended to limit the scope of the present disclosure. The technical idea of the present disclosure is not limited by the exemplary embodiments. The scope of protection sought by the present disclosure is defined by the appended claims and all equivalents thereof are construed to be within the true scope of the present disclosure.

What is claimed is:

1. An organic light-emitting display (OLED) device comprising:
    an organic light-emitting element on a substrate; and
    an encapsulation layer covering the organic light-emitting element and configured to block moisture and oxygen from permeating,
    wherein the encapsulation layer includes a barrier film having a barrier coating layer and a plurality of transmittance adjusting layers that adjust a transmittance ratio of light emitted from the organic light-emitting element and an adhesive film configured to attach the barrier film to the organic light-emitting element,
    wherein the barrier coating layer is made of a flexible transparent polymer resin, and the plurality of transmittance adjusting layers are made of silicon oxide (Si-Oxide) or titanium oxide (Ti-Oxide), and the plurality of transmittance adjusting layers are disposed above and below the barrier coating layer, and
    wherein the adhesive film includes a light-absorbing material for adjusting a transmittance of the light.

2. The OLED device of claim 1, wherein the plurality of transmittance adjusting layers are configured to adjust the transmittance of the light emitted from the organic light-emitting element to provide luminance required for implementing virtual reality.

3. The OLED device of claim 1, wherein the plurality of transmittance adjusting layers include two to seven layers.

4. The OLED device of claim 1, wherein each of the plurality of transmittance adjusting layers has a thickness of 0.01 μm to 1 μm.

5. The OLED device of claim 1, wherein the adhesive layer and the plurality of transmittance adjusting layers are configured to allow the light emitted from the organic light-emitting element to pass through the adhesive layer and the plurality of transmittance adjusting layers at a resulting total transmittance of 40 to 60%.

6. The OLED device of claim 5, wherein the adhesive layer and the plurality of transmittance adjusting layers reduce a luminance on behalf of a polarizing plate, to thus forego a use of the polarizing plate.

7. An organic light-emitting display (OLED) device employed by equipment for implementing virtual reality, the OLED device comprising:
    a structure for adjusting transmittance to provide luminance characteristics for a display device for implementing virtual reality image display characteristics,
    wherein the structure for adjusting transmittance includes a barrier film and an adhesive film, the barrier film comprising a barrier coating layer and a plurality of transmittance adjusting layers, and the adhesive film having a light-absorbing material, and
    wherein the barrier coating layer is made of a flexible and transparent polymer resin and is configured for suppressing at least one of oxygen and moisture from permeating, and the plurality of transmittance adjusting layers are disposed above and below the barrier coating layer.

8. The OLED device of claim 7, wherein the structure for adjusting transmittance is configured to adjust a transmittance of light generated in an organic light-emitting element so that the OLED device exhibits a luminance according to use environment for implementing the virtual reality image display characteristics.

* * * * *